(12) United States Patent
Chen et al.

(10) Patent No.: US 10,067,165 B2
(45) Date of Patent: Sep. 4, 2018

(54) ISOLATED DIFFERENTIAL VOLTAGE PROBE FOR EMI NOISE SOURCE

(71) Applicant: Ford Global Technologies, LLC, Dearborn, MI (US)

(72) Inventors: Chingchi Chen, Ann Arbor, MI (US); Richard William Kautz, North Branch, MI (US); Zhuxian Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 151 days.

(21) Appl. No.: 14/846,521

(22) Filed: Sep. 4, 2015

(65) Prior Publication Data
US 2017/0067940 A1 Mar. 9, 2017

(51) Int. Cl.
*G01R 15/18* (2006.01)
*G01R 17/02* (2006.01)
*G01R 29/26* (2006.01)
*G01R 19/00* (2006.01)
*G01R 31/00* (2006.01)

(52) U.S. Cl.
CPC .......... *G01R 15/183* (2013.01); *G01R 17/02* (2013.01); *G01R 29/26* (2013.01); *G01R 19/0084* (2013.01); *G01R 31/001* (2013.01)

(58) Field of Classification Search
CPC .. G01R 15/183; G01R 29/26; G01R 19/0084; G01R 17/02
USPC ............................ 324/127, 76.11, 76.66, 126
See application file for complete search history.

(56) References Cited

U.S. PATENT DOCUMENTS

| 3,986,116 | A | 10/1976 | Smith et al. |
| 4,879,507 | A | 11/1989 | Smith |
| 5,793,214 | A * | 8/1998 | Wakamatsu ......... G01N 27/023 324/127 |
| 6,028,423 | A | 2/2000 | Sanchez |
| 6,841,986 | B1 | 1/2005 | Tannehill |
| 7,242,176 | B2 * | 7/2007 | Thomason ........... G01R 31/002 324/501 |

(Continued)

FOREIGN PATENT DOCUMENTS

| CN | 101458284 A | 6/2009 |
| EP | 0302730 A2 | 2/1989 |

(Continued)

OTHER PUBLICATIONS

Search Report for Great Britain Application No. GB1614875.1, dated Jan. 11, 2017, 5 pages.

*Primary Examiner* — Giovanni Astacio-Oquendo
(74) *Attorney, Agent, or Firm* — James P. Muraff; Neal, Gerber & Eisenberg LLP

(57) ABSTRACT

A differential voltage probe for providing accurate measurement of differential voltage with high frequency components is disclosed that is further configured to accurately identify noise sources in EMI/EMC applications. The differential voltage probe is configured to provide the benefits of adequate differential voltage measurement bandwidth, galvanic isolation capability, high CMRR, flexible design to accommodate various requirements on voltage rating, loading effect, and frequency range of interest; and/or easy implementation and low cost. The differential voltage probe is able to achieve these optimized capabilities by implementing unique winding designs for transformer(s) used in the differential voltage probe circuit design.

19 Claims, 6 Drawing Sheets

(56) References Cited

U.S. PATENT DOCUMENTS

| | | | |
|---|---|---|---|
| 7,952,375 B2* | 5/2011 | Eldridge | G01R 1/06711 |
| | | | 324/754.03 |
| 8,693,528 B1 | 4/2014 | Shrestha et al. | |
| 2002/0093410 A1* | 7/2002 | Nakayama | H01F 38/08 |
| | | | 336/182 |
| 2005/0083040 A1 | 4/2005 | Proctor | |
| 2007/0257657 A1 | 11/2007 | Stevens et al. | |
| 2007/0257663 A1 | 11/2007 | Mende et al. | |
| 2009/0289755 A1* | 11/2009 | Yu | H01F 27/36 |
| | | | 336/84 R |
| 2010/0033165 A1 | 2/2010 | Rostamzadeh | |
| 2012/0038229 A1* | 2/2012 | Watanabe | H02K 1/30 |
| | | | 310/43 |
| 2015/0054492 A1 | 2/2015 | Mende et al. | |
| 2015/0301112 A1* | 10/2015 | Arenz | H02H 3/083 |
| | | | 324/424 |
| 2015/0377930 A1* | 12/2015 | Youn | H01H 83/02 |
| | | | 361/87 |
| 2016/0197620 A1* | 7/2016 | Gore | H03M 3/35 |
| | | | 324/207.15 |

FOREIGN PATENT DOCUMENTS

| GB | 1524793 A | 9/1978 |
|---|---|---|
| WO | WO 2009036989 A1 | 3/2009 |

* cited by examiner

ISOLATED DIFFERENTIAL VOLTAGE PROBE FOR EMI NOISE SOURCE

BACKGROUND

For electromagnetic interference (EMI) and electromagnetic compatibility (EMC) applications, including power electronics devices that involve switching mechanisms, tools have been developed that are capable of identifying noise sources by measuring differential voltage. However, existing tools do not provide optimum performance across multiple measurement characteristics. For instance, existing tools are not able to provide accurate differential voltage measurements at high frequencies, galvanic isolation, and common-mode rejection ratio at high frequencies.

It follows that this disclosure generally relates to a new and unique isolated differential voltage probe configured to provide optimized performance across multiple measurement characteristics.

SUMMARY

The differential voltage probe described herein is specially configured to provide accurate differential voltage measurements at high frequencies, galvanic isolation, and sufficient common-mode rejection ratio at high frequencies.

Exemplary embodiments provide a differential voltage probe comprising a transformer comprising a magnetic core, a primary winding, and a first secondary winding, a first capacitor coupled to the primary winding, and a second capacitor coupled to the primary winding. The first secondary winding is coupled to a connector configured to couple to a voltage measurement unit.

Exemplary embodiments may also provide a differential voltage probe comprising a first transformer, a second transformer coupled to a connector configured to couple to a voltage measurement unit, a bypass transformer, a first capacitor coupled to the first transformer, and a second capacitor coupled to the first transformer.

This application is defined by the appended claims. The description summarizes aspects of embodiments of the disclosure and should not be used to limit the claims. Other implementations are contemplated in accordance with the techniques described herein, as will be apparent upon examination of the following drawings and description, and such implementations are intended to be within the scope of this disclosure.

BRIEF DESCRIPTION OF THE DRAWINGS

For a better understanding, reference may be made to embodiments shown in the following drawings. The components in the drawings are not necessarily to scale and related elements may be omitted so as to emphasize and clearly illustrate the novel features described herein. In addition, system components can be variously arranged, as known in the art. In the figures, like referenced numerals may refer to like parts throughout the different figures unless otherwise specified.

DETAILED DESCRIPTION

Figure 1:
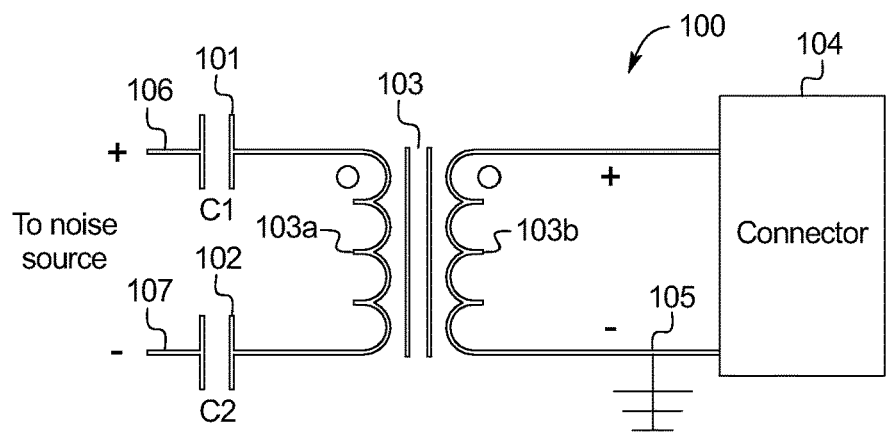
FIG. 1 illustrates an exemplary circuit diagram for a first differential voltage probe configuration, according to some embodiments.

There are shown in the drawings, and will hereinafter be described, some exemplary and non-limiting embodiments, with the understanding that the present disclosure is to be considered an exemplification and is not intended to limit the features described herein to the specific embodiments illustrated. Not all of the components described in this disclosure may be required, however, and some implementations may include additional, different, or fewer components from those expressly described in this disclosure. Variations in the arrangement and type of the components may be made without departing from the spirit or scope of the claims as set forth herein.

Accurate measurements of differential voltage for high frequency components of a device under testing (DUT) is an important measurement for quickly and accurately determining noise sources in EMI/EMC applications. However, known commercial differential voltage probes have drawbacks that can become barriers for engineers/technicians to debug EMI/EMC issues efficiently. For example, known commercial differential voltage probes are may not be able to provide sufficient frequency response to measure the full bandwidth of power electronics emissions. In other words, known commercial differential voltage probes cannot give accurate results for frequencies above 50 MHz, which means such commercial differential voltage probes cannot cover most of the frequency range of interest in EMC areas (e.g., FM band). Known commercial differential voltage probes may also not be able to provide galvanic isolation. Known commercial differential voltage probes may also not be able to sufficient common-mode rejection ratio (CMRR) at high frequencies.

Switching mechanisms found in power electronics are known to be a primary noise source for EMI generation in power converters. For providing root cause analysis, it is desirable to measure the high frequency components of differential voltage across power semiconductor devices accurately. Considering the limitations with current commercial differential voltage probes, it is beneficial to develop a differential voltage probe with adequate measurement bandwidth and resolution at high frequencies.

Therefore, this disclosure describes a differential voltage probe configured to provide the following advantageous capabilities: adequate differential voltage measurement bandwidth (e.g., up to 300 MHz); galvanic isolation capability; high CMRR (CMRR can be as high as 40 dB for all the measurement frequency range); flexible design to accommodate with various requirements on voltage rating, loading effect, and frequency range of interest; and/or easy implementation and low cost. The differential voltage probe described herein is able to achieve these optimized capabilities by implementing unique winding designs for transformer(s) used in the differential voltage probe circuit design.

FIG. 1 illustrates a first differential voltage probe 100 configured in a first probe configuration. The first differential voltage probe 100 comprises transformer 103, first capacitor (C1) 101, second capacitor (C2) 102, first probe tip 106, second probe tip 107, connector 104, and ground node 105. Transformer 103 includes a primary winding 103a, and a secondary winding 103b.

According to the first probe configuration, the first differential voltage probe 100 is designed so first capacitor 101 is connected to the positive voltage node of the primary winding 103a. First capacitor 101 will then connect to first probe tip 106 for sensing the positive voltage point of a device under test (DUT). According to the first probe configuration, the first differential voltage probe 100 is also designed so second capacitor 102 is connected to the negative voltage node of the primary winding 103a. Second capacitor 102 will then connect to second probe tip 107 for sensing the negative voltage point of the DUT. The first probe tip 106 and second probe tip 107 are configured to contact the DUT so that a differential voltage of the DUT can be measured by the first differential voltage probe. Although FIG. 1 illustrates primary winding 103a connected to first capacitor 101 and second capacitor 102 at a first end and second end, respectively, according to some embodiments the first probe configuration may be configured to only include one of first capacitor 101 or second capacitor 102.

According to the first probe configuration, the secondary winding 130b is configured to connect to connector 104. Connector 104 is configured to connect to a voltage measurement unit (e.g., oscilloscope), where the voltage measurement unit receives the voltage signals from the DUT measured by the first probe tip 106 and second tip 107, and calculates the voltage differential between the voltage signals measured from the first probe tip 106 and second tip 107. The connector 104 may be, for example, a SMA or BNC type connector for providing a coaxial connecter to connect to the voltage measurement unit.

The negative voltage node on the secondary winding 103b is configured to connect to ground node 105.

The use of transformer 103 provides the benefit of galvanic isolation between the DUT and the voltage measurement unit. Different winding structures of the primary winding and secondary winding around transformer 103 results in different characteristics and may be used to derive specific benefits. For example, CMRR is highly dependent on winding-to-winding capacitance and turn-to-core capacitance. Detectable frequency bandwidth is related with leakage inductance characteristics of transformer 103.

Figure 2:
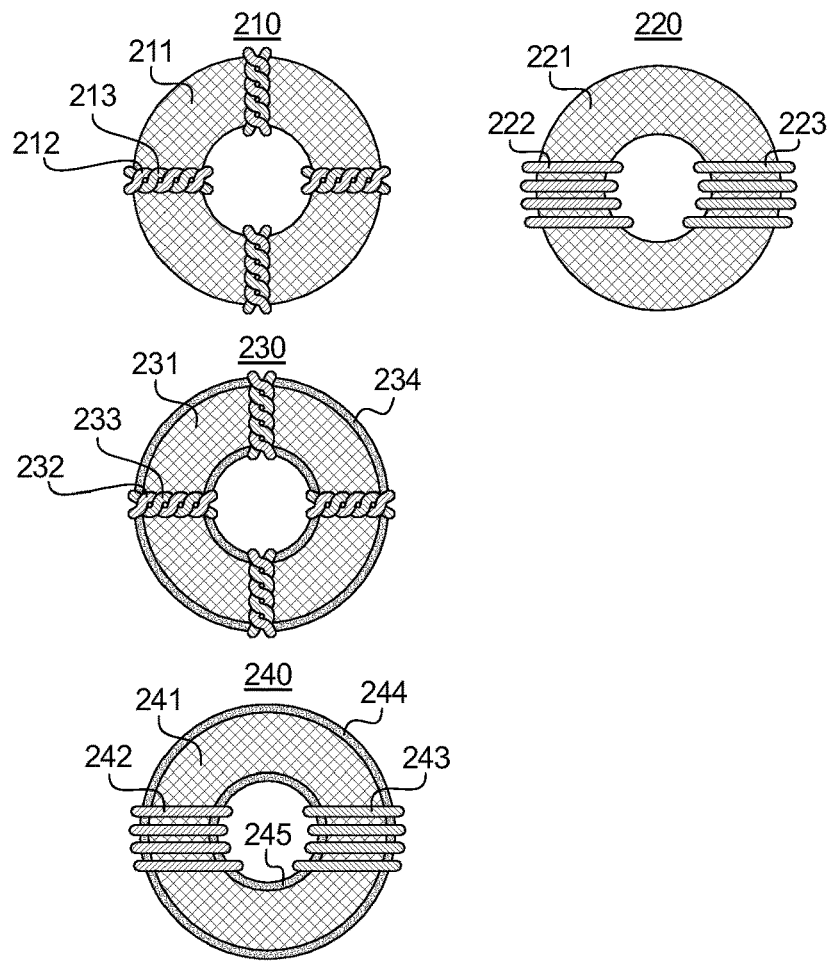
FIG. 2 illustrates exemplary winding configurations for a transformer included in the first differential voltage probe illustrated in FIG. 1, according to some embodiments.

FIG. 2 illustrates four exemplary winding configurations for primary windings and secondary windings around transformer 103 of the first differential voltage probe 100 configured according to the first probe configuration.

In winding configuration 210, primary winding 212 and secondary winding 213 may correspond to primary winding 103a and secondary winding 103b, respectively. Primary winding 212 and secondary winding 213 are twisted and wounded on magnetic core 211 of transformer 103. The twisted windings results in low leakage inductance, and therefore, improves the frequency bandwidth (e.g., adequate differential voltage measurements for frequencies in bandwidths up to 300 MHz) in which differential voltages may be measured by the first differential voltage probe 100. By improving the measurable frequency bandwidth, the first differential voltage probe 100 may measure differential voltages at higher frequencies on the order of up to 300 MHz which allows for quicker and more accurate identification of noise sources in the DUT. However, the twisted winding structure also increases parasitic capacitance between primary windings and secondary windings, which provides a commutation path for common mode current and may reduce CMRR capabilities for the first differential voltage probe 100.

In winding configuration 220, primary winding 222 and secondary winding 223 may correspond to primary winding 103a and secondary winding 103b, respectively. Primary winding 222 and secondary winding 223 are wounded separately on two opposite, or predominately opposite, sides of the magnetic core 221 of transformer 103. The design of winding primary winding 222 and secondary winding 223 to be opposite from each other in winding configuration 220 reduces the capacitance between primary windings and secondary windings, which may benefit CMRR (i.e., increase CMRR up to 40 dB for all the measurable frequency ranges). However, the leakage inductance may increase and the measurable frequency bandwidth may decrease with winding configuration 220.

In winding configuration 230, primary winding 232 and secondary winding 233 may correspond to primary winding 103a and secondary winding 103b, respectively. Primary winding 232 and secondary winding 233 are twisted similar to the design illustrated in winding configuration 210. In addition, winding configuration 230 further includes a gap 234 between magnetic core 231 and windings (e.g., primary winding 232 and secondary winding 233), where the gap 234 is created by air, taping, or filling epoxy. Including the gap 234 results in a reduction of the turn-to-core capacitance, and improves CMRR.

In winding configuration 240, primary winding 242 and secondary winding 243 may correspond to primary winding 103a and secondary winding 103b, respectively. Primary winding 242 and secondary winding 243 are wounded separately on two opposite, or predominately opposite, sides of the magnetic core 241 of transformer 103 similar to the design illustrated in winding configuration 220. In addition, winding configuration 240 includes a first gap 244 and second gap 245 between magnetic core 241 and windings (e.g., primary winding 242 and secondary winding 243), where the first gap 244 and the second gap 245 is created by taping or filling epoxy. Including the gap 244 results in a reduction of the turn-to-core capacitance, and improves CMRR.

It should be noted that gap 234, first gap 241, and second gap 245 describe a gap between a magnetic core (e.g., magnetic core 231 or magnetic core 241) and windings that are wound around the magnetic core.

Referring back to the circuit diagram for the first differential voltage probe 100 in the first configuration illustrated in FIG. 1, configuring first capacitor 101 and second capacitor 102 in series provides attenuation for the power harmonics components at direct current (DC) and lower frequencies, but also allows higher frequency components to pass through. The two capacitors (first capacitor 101 and second capacitor 102) prevent transformer 103 from being saturated in measuring power electronics waveforms. The two capacitors (first capacitor 101 and second capacitor 102) also provide protection for the voltage measurement unit (e.g., oscilloscope) in case the transformer windings (first capacitor 101 and/or second capacitor 102) are shorted. At the same time, the capacitance can be selected accordingly to achieve large input impedance and meet the requirement on the loading. The capacitance of first capacitor 101 and/or second capacitor 102 may be the same or have different values for additional benefits in some measurement conditions.

Connector 104 is configured to connect to a coaxial cable, where the coaxial cable is used to transmit signals from connector 104 to the oscilloscope and preserve high frequencies components. The voltage measurement unit may be terminated to 50 Ω when using the first differential voltage probe 100.

An accurate voltage ratio over the whole frequency range of interest may be obtained by measuring the transfer function using a network analyzer. The network analyzer may be an instrument configured to characterize two-port networks. In this case, the network analyzer is enabled to measure the transfer function of the first differential voltage probe 100.

Then, with the transfer function and the spectrum measured by the voltage measurement unit (e.g., oscilloscope), the DUT voltage spectrum can be back calculated. The DUT voltage spectrum may be a function, f(X, Y), where X is a spectrum measurement obtained by the voltage measurement unit (e.g. an oscilloscope) and Y is a transfer function measured by the network analyzer.

CMRR of the first differential voltage probe 100 in the first probe configuration is defined as the rejection of unwanted input signals common to both input leads (first probe tip 106 and second probe tip 107), relative to the wanted difference signal. To measure CMRR of the first differential voltage probe 100, differential mode (DM) and common mode (CM) are injected from the first differential voltage probe 100's inputs (first probe tip 106 and second probe tip 107) and signals are measured from first differential voltage probe 100's outputs with the network analyzer. The transfer functions can be derived from the measurements. Finally, the ratio between DM and CM measurement results is the CMRR measurement. CMRR may be measured in a like manner for other differential voltage probes designed according to other probe configurations described herein.

The magnetic core of transformer 103 may be a composition comprised primarily of iron or steel. Primary winding 103a and/or secondary winding 103b may be, for example, either copper or aluminum.

Figure 3:
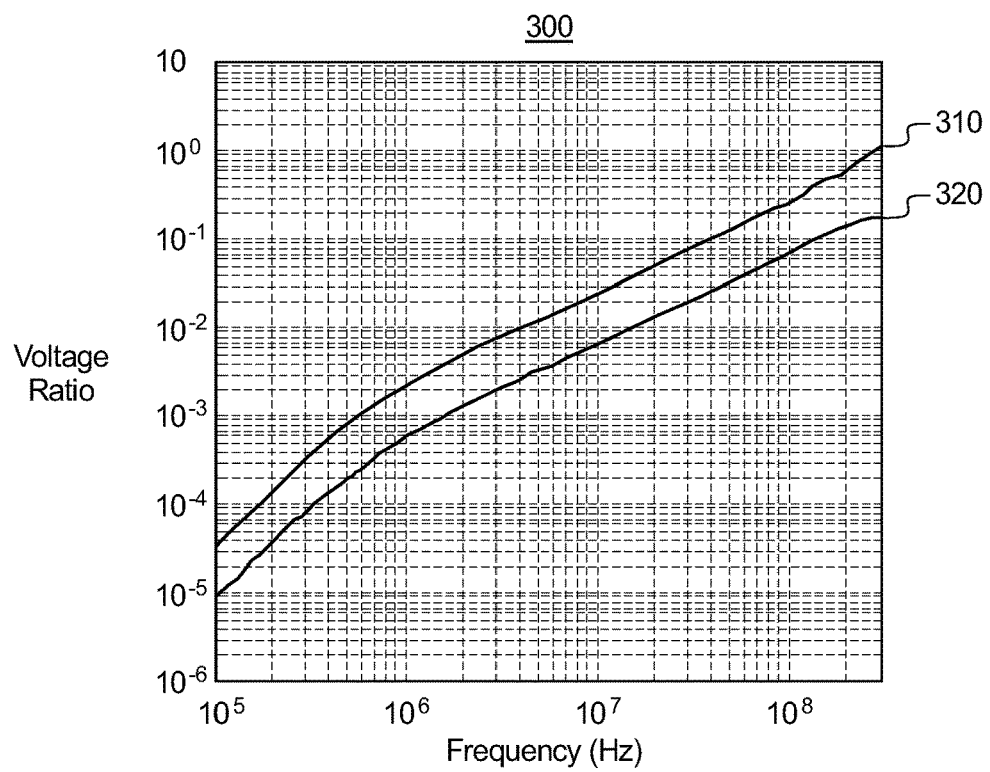
FIG. 3 illustrates a first curve plotting frequency against voltage ratio for a DM noise injection and a second curve plotting frequency against voltage ratio for a CM noise injection for the first differential voltage probe illustrated in FIG. 1, according to some embodiments.
Figure 4:
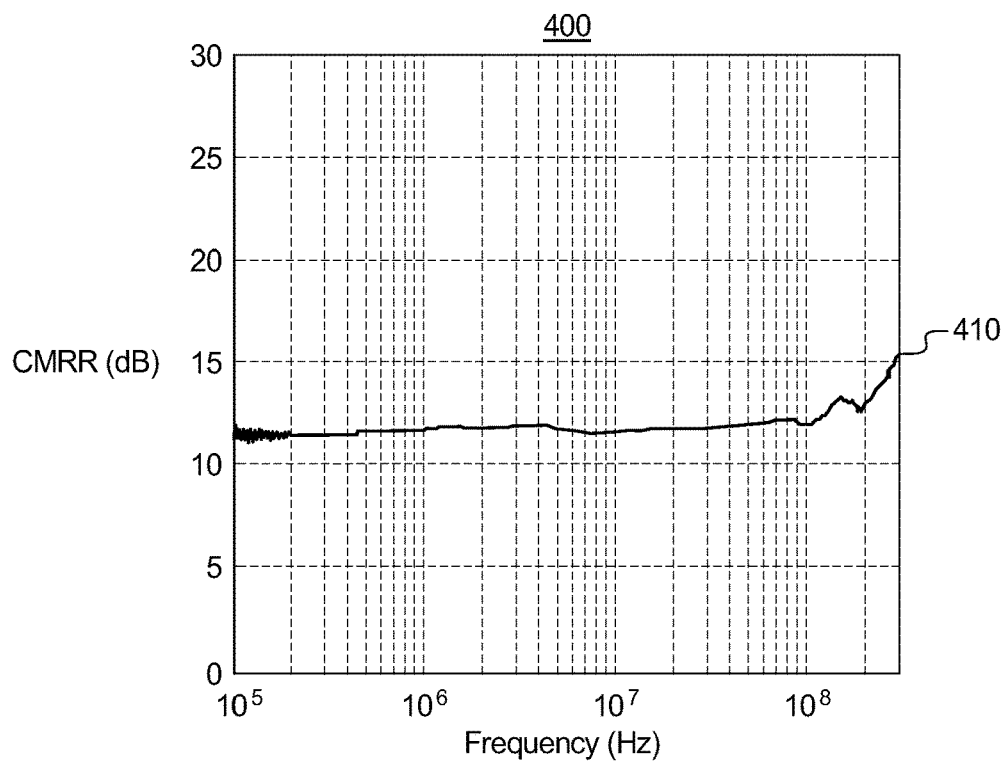
FIG. 4 illustrates a curve plotting frequency against CMRR (dB) for the first differential voltage probe illustrated in FIG. 1, according to some embodiments.

FIG. 3 illustrates the transfer function from the first differential voltage probe 100's input to output for DM noise injection (curve 310) and CM noise injection (curve 320), respectively. CMRR is then calculated and shown by curve 410 illustrated in FIG. 4. Curve 410 describes CMRR of the first differential voltage probe 100 is between 10 dB-15 dB in the frequency range of 100 kHz to 300 MHz. In cases where higher CMRR is required, the following differential voltage probe configurations illustrated in FIG. 5 and FIG. 9 may be provided for purposes of improved CMRR.

Figure 5:
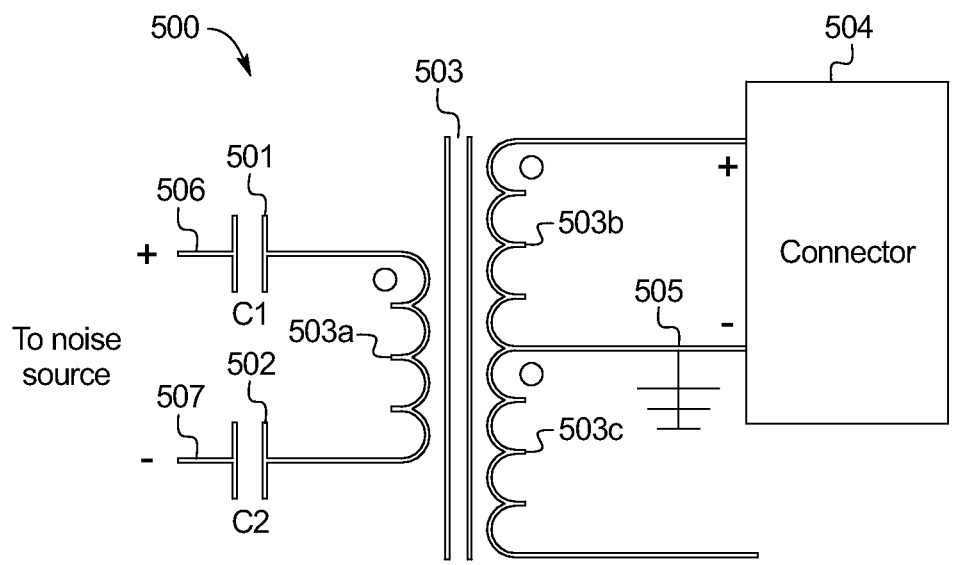
FIG. 5 illustrates an exemplary circuit diagram for a second differential voltage probe, according to some embodiments.

FIG. 5 illustrates a circuit diagram for a second differential voltage probe 500 designed according to a second probe configuration. The second differential voltage probe 500 comprises transformer 503, first capacitor (C1) 501, second capacitor (C2) 502, first probe tip 506, second probe tip 507, connector 504, and ground node 505. Transformer 503 includes a primary winding 503a, and a first secondary winding 503b, and a second secondary winding 503c.

According to the second probe configuration, second differential voltage probe 500 is designed so first capacitor 501 is connected to the positive voltage node on the primary winding 503a. First capacitor 501 will then connect to first probe tip 506 for sensing the positive voltage point of a device under test (DUT). According to the second probe configuration, the second differential voltage probe 500 is also designed so second capacitor 502 is connected to the negative voltage node on the primary winding 503a. Second capacitor 502 will then connect to second probe tip 507 for sensing the negative voltage point of the DUT. The first probe tip 506 and second probe tip 507 are configured to contact the DUT so that a differential voltage of the DUT can be measured by the first differential voltage probe. Although FIG. 5 illustrates primary winding 503a connected to first capacitor 501 and second capacitor 502 at a first end and second end, respectively, according to some embodiments the second probe configuration may be configured to only include one of first capacitor 501 or second capacitor 502.

Compared with the first probe configuration of the first differential voltage probe 100, the second probe configuration of the second differential voltage probe 500 has additional secondary windings with the addition of second secondary winding 503c. Second secondary winding 503c is grounded at one end and floating at the other end, as shown in FIG. 5. In the first probe configuration of the first differential voltage probe 100, the parasitic capacitance from transformer 103 primary side (i.e., side including primary winding 103a) to secondary side (side including secondary winding 103b) provides a commutation loop for CM current, and thus, deteriorates CMRR. In the second probe configuration of second differential voltage probe 500, the addition of second secondary winding 503c provides a symmetric structure for common mode current. The common mode currents flowing to two secondary windings (first secondary winding 503b and second secondary winding 503c) are equal. Therefore, the fluxes caused by common mode current in the two secondary windings, first secondary winding 503b and second secondary winding 503c, cancel each other due to their opposite polarity. As a result, the design of the second differential voltage probe 500 effectively improves CMRR.

Figure 6:
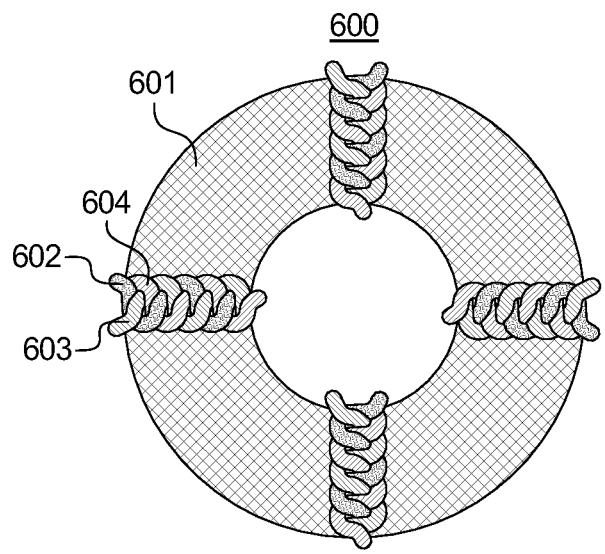
FIG. 6 illustrates an exemplary winding configuration for a transformer included in the second differential voltage probe illustrated in FIG. 5, according to some embodiments.

Various winding structures can be utilized for the transformer 503 to meet different specifications for the second differential voltage probe 500. One example is to twist the primary winding 503a and two secondary windings (first secondary winding 503b and second secondary winding 503c) to form a trifilar structure around the magnetic core of transformer 503. For example, FIG. 6 illustrates an exemplary winding configuration 600 around magnetic core 601, where magnetic core 601 may correspond to the magnetic core of transformer 503. In FIG. 6, winding configuration 600 is comprised of primary winding 602, first secondary winding 603, and second secondary winding 604 which may correspond to primary winding 503a, first secondary winding 503b, and second secondary winding 503c of transformer 503, respectively.

The magnetic core of transformer 503 may be a composition comprised primarily of iron or steel. Primary winding 503a, first secondary winding 503b, and/or second secondary winding 503c may be, for example, either copper or aluminum.

Figure 7:
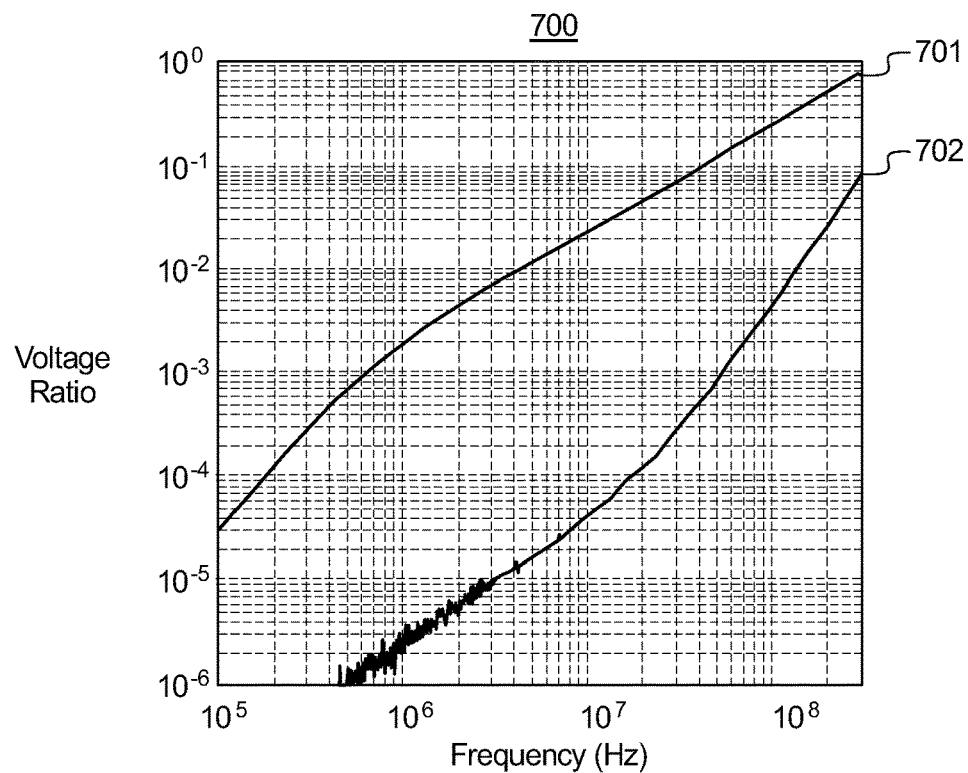
FIG. 7 illustrates a first curve plotting frequency against voltage ratio for a DM noise injection and a second curve plotting frequency against voltage ratio for a CM noise injection for the second differential voltage probe illustrated in FIG. 5, according to some embodiments.

FIG. 7 illustrates graph 700 that plots the transfer function from the second differential voltage probe 500's input to output for DM injections (curve 701) and CM injections (curve 702) that utilizes the second probe configuration for the second differential voltage probe 500 as described herein.

Figure 8:
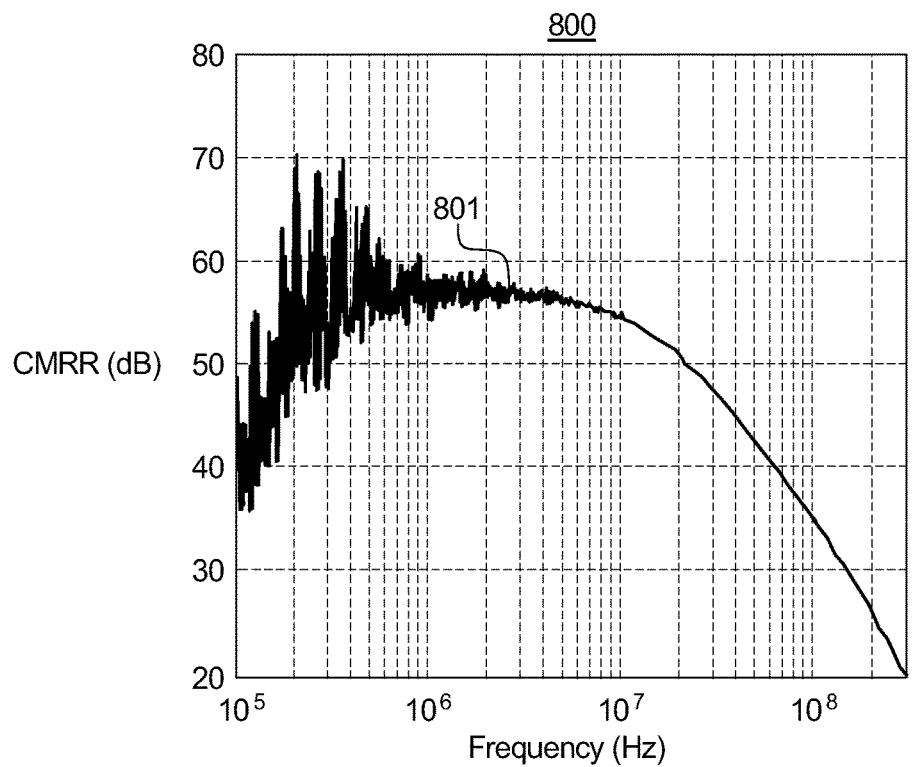
FIG. 8 illustrates a curve plotting frequency against CMRR (dB) for the second differential voltage probe illustrated in FIG. 5, according to some embodiments.

FIG. 8 illustrates graph 800 that includes curve 801 that plots the calculated CMRR across a frequency range for the second differential voltage probe 500 as described herein. CMRR of the second differential voltage probe 500 configured according to the second probe configuration is more than 40 dB up to 70 MHz and 20 dB up to 300 MHz.

Figure 9:
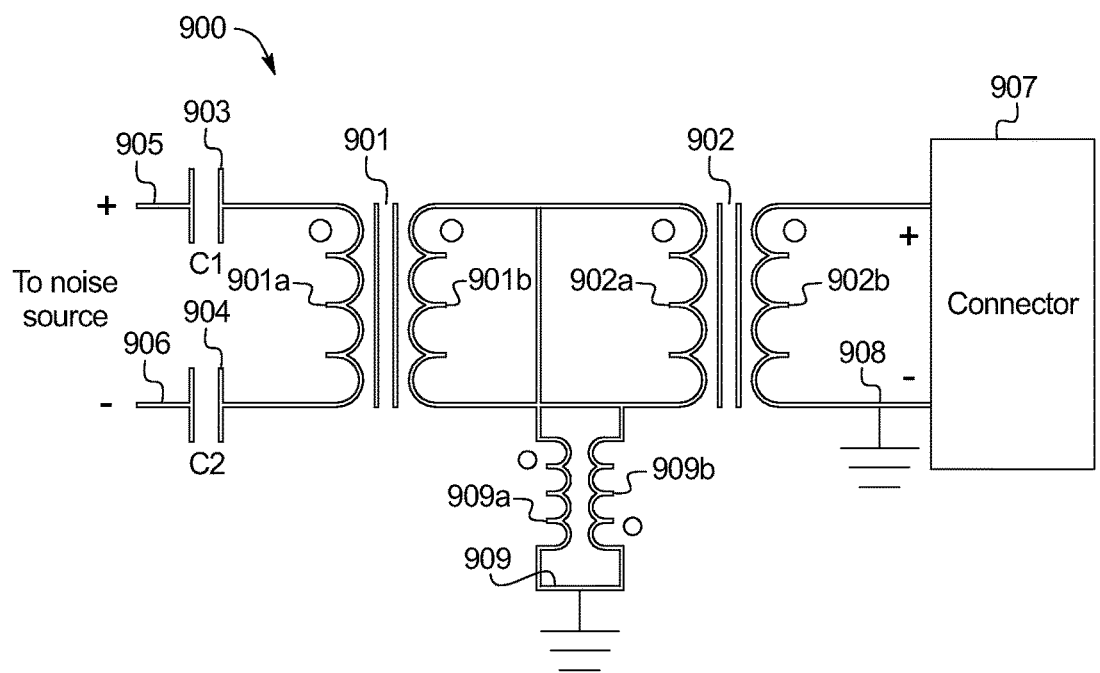
FIG. 9 illustrates an exemplary circuit diagram for a third differential voltage probe, according to some embodiments.

FIG. 9 illustrates a circuit design for a third differential voltage probe 900 configured in a third probe configuration. The third differential voltage probe 900 comprises first transformer 901, second transformer 902, first capacitor (C1) 903, second capacitor (C2) 904, first probe tip 905, second probe tip 906, connector 907, ground node 908, and CM bypass 909. First transformer 901 includes a primary winding 901a, and a secondary winding 901b. Similarly, second transformer 902 includes a primary winding 902a, and a secondary winding 902b.

According to the third probe configuration, the third differential voltage probe 900 is designed so first capacitor 903 is connected to the positive voltage node on primary winding 901a of first transformer 901. First capacitor 903 will then connect to first probe tip 905 for sensing the positive voltage point of a device under test (DUT). According to the third probe configuration, the third differential voltage probe 900 is also designed so second capacitor 904 is connected to the negative voltage node on the primary winding 901a of first transformer 901. Second capacitor 904 will then connect to second probe tip 906 for sensing the negative voltage point of the DUT. The first probe tip 905 and second probe tip 906 are configured to contact the DUT so that a differential voltage of the DUT can be measured by the first differential voltage probe. Although FIG. 9 illustrates primary winding 901a connected to first capacitor 903 and second capacitor 904 at a first end and second end, respectively, according to some embodiments the third probe configuration may be configured to include only one of first capacitor 903 or second capacitor 904.

The third differential voltage probe 900 in the third probe configuration includes an additional transformer in second transformer 902, and a CM bypass 909 that is not included in the first differential voltage probe 100 or the second differential voltage probe 500. The additional CM bypass 909 enables the third differential voltage probe 900 to provide high impedance for DM signals and very low impedance for CM signals. High DM impedance ensures that CM bypass 909 does not significantly change the third differential voltage probe 900's measurable bandwidth, and low CM impedance helps improve the CMRR for the third differential voltage probe 900.

Figure 10:
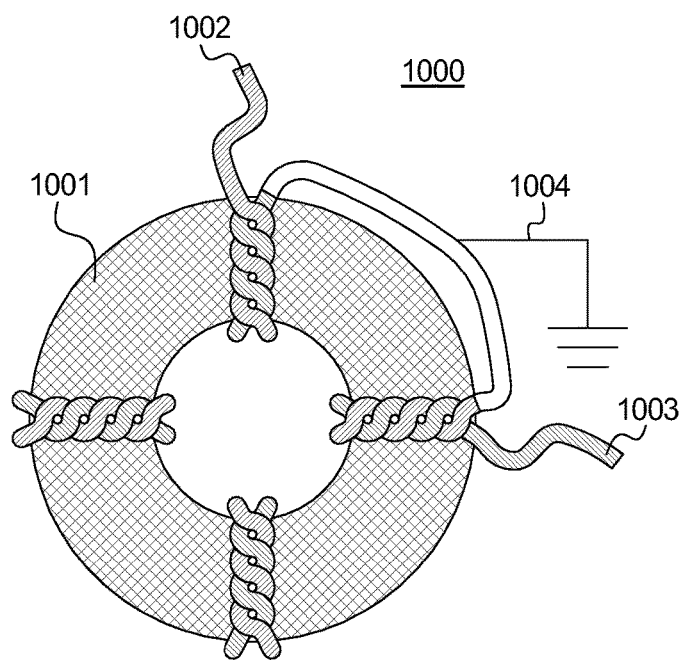
FIG. 10 illustrates an exemplary winding configuration for a bypass transformer included in the third differential voltage probe illustrated in FIG. 9, according to some embodiments.

FIG. 10 illustrates an exemplary winding configuration 1000 for windings around CM bypass 909 of the third differential voltage probe 900 designed according to the third probe configuration. The additional CM bypass 909 is a type of transformer that helps balance the signal paths of the third differential voltage probe. Winding configuration 1000 is comprised of primary winding 1002 and secondary winding 1003 which may correspond to primary winding 909a and secondary winding 909b, respectively, of CM bypass 909. Primary winding 1002 and secondary winding 1003 are twisted and wound around magnetic core 1001 of the CM bypass 909. Winding configuration 1000 further includes a bypass circuit 1004 that connects both primary winding 1002 and secondary winding 1003 to ground. With this circuit configuration, the CM bypass 909 is enabled to provide low CM impedance for the third differential voltage probe 900.

For the third differential voltage probe 900 designed according to the third probe configuration, both the first transformer 901 and second transformer 902 may be configured to have a winding configuration corresponding to one of winding configuration 210, winding configuration 220, winding configuration 230, or winding configuration 240.

Each of primary winding 901a, primary winding 902a, and primary winding 909a may correspond to a same winding. Each of secondary winding 901b, secondary winding 902b, and secondary winding 909b may correspond to a same winding.

Figure 11:
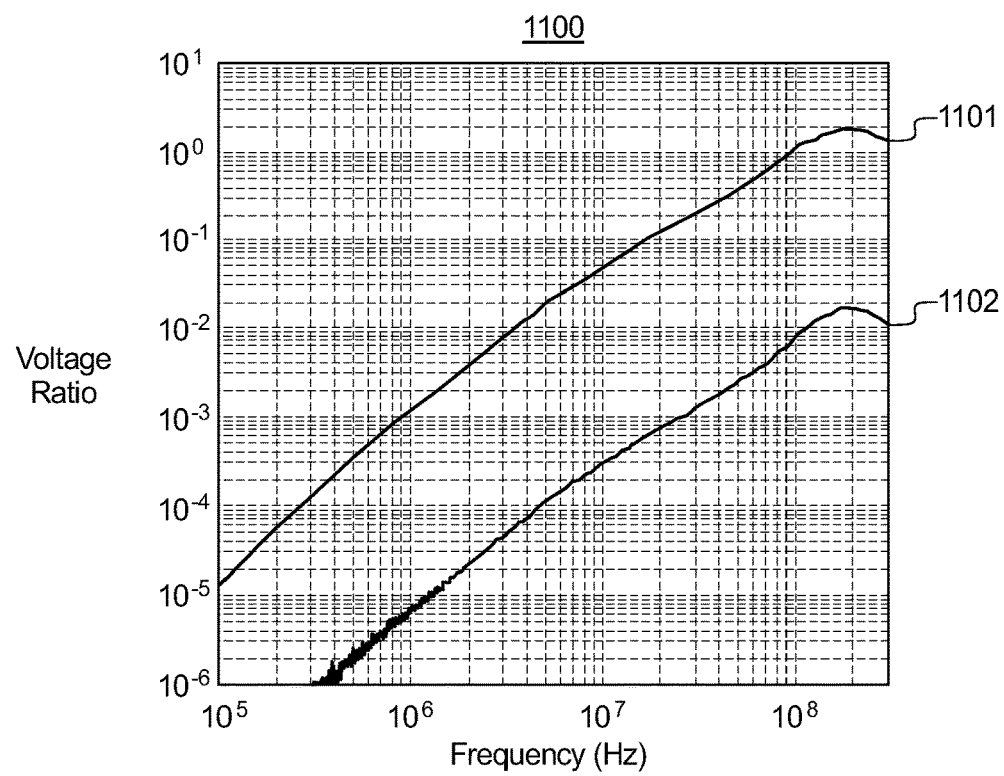
FIG. 11 illustrates a first curve plotting frequency against voltage ratio for a DM noise injection and a second curve plotting frequency against voltage ratio for a CM noise injection for the third differential voltage probe configuration illustrated in FIG. 9, according to some embodiments.

FIG. 11 illustrates graph 1100 that plots the transfer function from the third differential voltage probe 900's input to output for DM injections (curve 1101) and CM injections (curve 1102), where the third differential voltage probe 900 is configured according to the third probe configuration.

Figure 12:
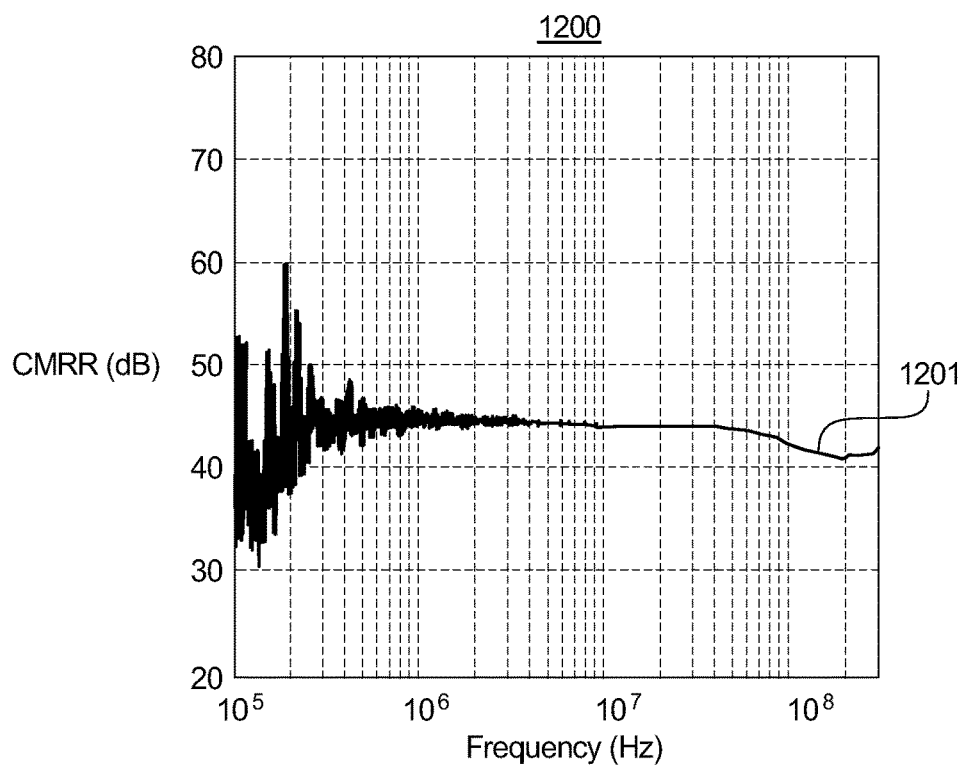
FIG. 12 illustrates a curve plotting frequency against CMRR (dB) for the third differential voltage probe configuration illustrated in FIG. 9, according to some embodiments.

FIG. 12 illustrates graph 1200 that includes curve 1201 that plots the CMRR across a frequency range for the third differential voltage probe 900, where the third differential voltage probe 900 is configured according to the third probe configuration. CMRR of the third differential voltage probe 900 is more than 40 dB across a frequency of up to 300 MHz.

The magnetic core of first transformer 901, second transformer 902, and/or CM bypass 909 may be a composition comprised primarily of iron or steel. The windings that are wound around first transformer 901, second transformer 902, and/or CM bypass 909 may be, for example, either copper or aluminum.

Any process descriptions or blocks in the figures, should be understood as representing modules, segments, or portions of code which include one or more executable instructions, executable by a computing device, processor, or controller (e.g., control unit), for implementing specific logical functions or steps in the process, and alternate implementations are included within the scope of the embodiments described herein, in which functions may be executed out of order from that shown or discussed, including substantially concurrently or in reverse order, depending on the functionality involved, as would be understood by those having ordinary skill in the art.

It should be emphasized that the above-described embodiments, are merely set forth for a clear understanding of the principles of this disclosure. Many variations and modifications may be made to the above-described embodiment(s) without substantially departing from the spirit and principles of the techniques described herein. All such modifications are intended to be included herein within the scope of this disclosure and protected by the following claims.

What is claimed is:

1. A differential voltage probe comprising:
   a transformer comprising a magnetic core, a primary winding, and a first secondary winding, the transformer configured to enable the differential voltage probe to provide galvanic isolation between a device being tested and a voltage measurement unit;
   a capacitor coupled to a first end of the primary winding; and
   wherein the first secondary winding is coupled to a connector configured to couple to the voltage measurement unit.

2. The differential voltage probe of claim 1, wherein the capacitor is configured to couple to a first probe tip; and
   a second end of the primary winding is configured to couple to a second probe tip.

3. The differential voltage probe of claim 1, wherein the primary winding and the first secondary winding are wound around the magnetic core.

4. The differential voltage probe of claim 3, further comprising at least one gap portion between the magnetic core and the first secondary winding.

5. The differential voltage probe of claim 4, wherein the at least one gap portion is one of air, taping, or epoxy.

6. The differential voltage probe of claim 1, wherein the primary winding and the first secondary winding are braided together and wound around the magnetic core.

7. The differential voltage probe of claim 1, wherein the primary winding is wound around a first side of the magnetic core and the first secondary winding is wound around a second side of the magnetic core, wherein the first side of the magnetic core is substantially opposite the second side of the magnetic core.

8. The differential voltage probe of claim 1, further comprising a secondary capacitor coupled to a second end of the primary winding, wherein the secondary capacitor is configured to couple to a second probe tip.

9. The differential voltage probe of claim 1, wherein the transformer further includes a second secondary winding.

10. The differential voltage probe of claim 9, wherein the primary winding, the first secondary winding, and the second secondary winding are wound around the magnetic core.

11. The differential voltage probe of claim 10, further comprising at least one gap portion between the magnetic core and the primary winding, the first secondary winding, and the second secondary winding.

12. The differential voltage probe of claim 9, wherein the primary winding, the first secondary winding, and the second secondary winding are braided together and wound around the magnetic core.

13. A differential voltage probe comprising:
    a first transformer;
    a second transformer coupled to a connector configured to couple to a voltage measurement unit;
    a bypass transformer; and
    a first capacitor coupled to the first transformer.

14. The differential voltage probe of claim 13, wherein the bypass transformer comprises a magnetic core, a primary winding, and a secondary winding;
    wherein the primary winding and the secondary winding are wound around the magnetic core.

15. The differential voltage probe of claim 14, wherein the primary winding and the secondary winding are coupled to a ground connection.

16. The differential voltage probe of claim 13, wherein the first transformer comprises a first magnetic core, a first primary winding, and a first secondary winding;
    wherein the first primary winding and the first secondary winding are braided together and wound around the first magnetic core.

17. The differential voltage probe of claim 16, further comprising a second capacitor coupled to a second end of the first primary winding, wherein the second capacitor is configured to couple to a second probe tip; and
    wherein the first capacitor is coupled to a first end of the first primary winding and configured to couple to a first probe tip.

18. The differential voltage probe of claim 13, wherein the second transformer comprises a second magnetic core, a second primary winding, and a second secondary winding;
    wherein the second primary winding and the second secondary winding are braided together and wound around the second magnetic core.

19. The differential voltage probe of claim 13, wherein the first transformer and the second transformer are configured to enable the differential probe to provide galvanic isolation between a device being tested and the voltage measurement unit.

* * * * *